(12) United States Patent
Holt et al.

(10) Patent No.: US 7,528,050 B2
(45) Date of Patent: May 5, 2009

(54) HIGH PERFORMANCE FIELD EFFECT TRANSISTORS ON SOI SUBSTRATE WITH STRESS-INDUCING MATERIAL AS BURIED INSULATOR AND METHODS

(75) Inventors: Judson R. Holt, Wappingers Falls, NY (US); Qiqing C. Ouyang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/115,106

(22) Filed: May 5, 2008

(65) Prior Publication Data

US 2008/0206951 A1 Aug. 28, 2008

Related U.S. Application Data

(62) Division of application No. 11/088,595, filed on Mar. 24, 2005, now Pat. No. 7,388,278.

(51) Int. Cl.
*H01L 21/46* (2006.01)
(52) U.S. Cl. ............... 438/406; 438/456; 257/E21.567
(58) Field of Classification Search ........... 438/456; 257/64, E29.108
See application file for complete search history.

(56) References Cited

U.S. PATENT DOCUMENTS

| | | | |
|---|---|---|---|
| 6,998,684 B2 | 2/2006 | Anderson | |
| 7,192,842 B2 * | 3/2007 | Shao et al. | 438/455 |
| 2004/0217391 A1 | 11/2004 | Forbes | |
| 2004/0256700 A1 | 12/2004 | Doris et al. | |
| 2005/0181549 A1 | 8/2005 | Barr et al. | |
| 2006/0145264 A1 | 7/2006 | Chidambarrao et al. | |
| 2007/0246702 A1 * | 10/2007 | Andrieu et al. | 257/18 |

OTHER PUBLICATIONS

Shimizu, A. et al., "Local Mechanical-Stress Control (LMC): A New Technique for CMOS-Performance Enhancement" IEEE, (2001).
Ito, Shinya et al. "Mechanical Stress Effect of Etch-Stop Nitride and its Impact on Deep Submicron Transistor Design" IEEE (2000).
Oatsuka, F. et al., "A Highly Dense, High-Performance 13 nm node CMOS Technology for Large Scale System-on-a-Chip Application." IEEE (2000).

\* cited by examiner

*Primary Examiner*—Stephen W Smoot
(74) *Attorney, Agent, or Firm*—Scully, Scott, Murphy & Presser; Ido Tuchman, Esq.

(57) ABSTRACT

The present invention provides a semiconductor structure that includes a high performance field effect transistor (FET) on a semiconductor-on-insulator (SOI) in which the insulator thereof is a stress-inducing material of a preselected geometry. Such a structure achieves performance enhancement from uniaxial stress, and the stress in the channel is not dependent on the layout design of the local contacts. In broad terms, the present invention relates to a semiconductor structure that comprises an upper semiconductor layer and a bottom semiconductor layer, wherein said upper semiconductor layer is separated from said bottom semiconductor layer in at least one region by a stress-inducing insulator having a preselected geometric shape, said stress-inducing insulator exerting a strain on the upper semiconductor layer.

7 Claims, 5 Drawing Sheets

US 7,528,050 B2

HIGH PERFORMANCE FIELD EFFECT TRANSISTORS ON SOI SUBSTRATE WITH STRESS-INDUCING MATERIAL AS BURIED INSULATOR AND METHODS

RELATED APPLICATIONS

This application is a divisional of U.S. application Ser. No. 11/088,595 filed Mar. 24, 2005, now U.S. Pat. No. 7,388,278.

FIELD OF THE INVENTION

The present invention relates to a semiconductor structure and methods of fabricating the same. More particularly, the present invention relates to a semiconductor structure including a stress-inducing insulator as a buried insulator of a semiconductor-on-insulator (SOI) substrate. By using a stress-inducing insulator as the buried insulator a strain can be exerted on the top semiconductor, i.e., SOI, layer.

BACKGROUND OF THE INVENTION

It is widely regarded that conventional semiconductor device scaling has 'run-out' of steam. Therefore, novel semiconductor device performance enhancements are necessary to continue to meet performance targets. Many performance enhancements attempt to utilize the effect that is generally referred to by those skilled in the art as "strained silicon"—that is, by applying a stress to the silicon lattice in the channel that the carrier mobility is enhanced. The enhanced carrier mobility, in turn, provides a substantial improvement in device speed.

Previous innovations have shown that performance enhancement can result from a uniaxial stress applied to the channel by use of a stressed nitride film deposited over a polysilicon gate structure. In such instances, a tensile gate liner is applied to nFET (field effect transistor) devices to improve electron mobility, while a compressive gate liner is applied to pFET devices. However, the stress in the channel of such FET devices strongly depends on the layout of the local contacts. In particular, as the local contact gets closer to the gate (hence less room for a stressed liner) the strain in the channel region decreases and the device performance suffers. This can be a challenge for circuit designers, for instance devices with different local contact designs will exhibit different device characteristics.

Also, the amount of stress in the channel of a FET depends on the nitride liner thickness. In principle, the thicker the nitride liner, the larger the stress value will be. However, nitride stress liners cannot be too thick (greater than 1000 Å) due to process limitations.

Despite the advances made to date using stress engineering, there is still a need to provide different means for achieving semiconductor device performance improvement from uniaxial strain which is independent on the layout of the local contacts and is not adversely affected by process limitations.

SUMMARY OF THE INVENTION

The present invention provides a semiconductor structure that includes a high performance field effect transistor (FET) on a semiconductor-on-insulator (SOI) in which the insulator thereof is a stress-inducing material of a preselected geometry. Such a structure achieves performance enhancement from uniaxial stress, and the stress in the channel is not dependent on the layout design of the local contacts. Moreover, higher stress can be achieved in the present invention by using a thicker stress-inducing material which is not hindered by process limitations as is the case with prior art stress liners. The term "stress-inducing material or insulator" is used throughout the present application to denote a material such as a nitride or oxide that can introduce stress into another nearby material layer.

In preferred embodiments of the present invention, the stress-inducing insulator is a stressed nitride. Stress nitride insulators are preferred since they have better heat conductance than oxide which helps in reducing self-heating in SOI devices.

Additionally, since the FETs of the present invention are located on a SOI substrate, those devices have several advantages over more conventional FET devices that are located on a bulk semiconductor. For example, SOI devices may have lower power consumption requirements than other types of devices that perform similar tasks. SOI devices may also have lower parasitic capacitances than non-SOI devices. This translates into faster switching times for the resulting circuits. In addition, the phenomenon of "latchup," which is often exhibited by complementary metal oxide semiconductor (CMOS) devices, may be avoided when circuit devices are manufactured using SOI fabrication processes. SOI devices are also less susceptible to the adverse effects of ionizing radiation and, therefore, tend to be more reliable in applications where ionizing radiation may cause operation errors.

In broad terms, the present invention relates to a semiconductor structure that comprises an upper semiconductor layer and a bottom semiconductor layer, wherein said upper semiconductor layer is separated from said bottom semiconductor layer in at least one region by a stress-inducing insulator having a preselected geometric shape, said stress-inducing insulator exerting a strain on the upper semiconductor layer.

The inventive structure is particularly useful with ultra-thin semiconductor-on-insulator (UTSOI) devices since such devices will benefit the most from a stress-inducing insulator as the buried insulator because the stress in an SOI channel region increases as the SOI layer thickness decreases. Note that in the present invention the upper semiconductor layer represents the SOI layer of the structure. The term "ultra-thin" as used in the present invention denotes an upper semiconductor layer having a thickness of about 40 nm or less, preferably 20 nm or less. UTSOI potentially provides a technology that scales better than regular SOI and bulk CMOS. Having a fully depleted semiconductor body reduces the floating body effects. However, as the semiconductor thickness is scaled (5 nm<$T_{semi}$<20 nm), the channel mobility is degraded significantly. This is mainly due to increased phonon scattering (from quantum confinement). As the semiconductor thickness is scaled down further (less than 5 nm), the mobility degradation is mainly due to the potential variation that is a result of semiconductor roughness. By using a stress-inducing insulator as the buried insulator of an UTSOI structure, the channel mobility is greatly improved.

Furthermore, in the embodiment in which an UTSOI with a stress-inducing insulator is employed, it is highly preferred to have the notch on each of the semiconductor layers rotated by 45° so that the channel is along the <100> direction. In this case, the NFET is expected to be sensitive to stress and the pFET is much less sensitive to stress compared to the <100> channel. Therefore, a highly tensile stressed insulator can be used for both nFETs and pFETs. nFET mobility is enhanced due to tensile in the upper semiconductor layer, and the pFET mobility is not affected.

The stress can be 'tuned' in the present invention by structures inserted into the SOI layer/stress-inducing interface, possibly by using different structures for nFET regions and pFET regions of the device. That is, the stress-inducing insulator of the present invention has a preselected geometry associated therewith, which is formed by utilizing a prepatterned upper semiconductor layer.

In another embodiment of the present invention, a stress-inducing insulator is used as the buried insulator in a hybrid oriented substrate. In this case, the presence of the nitride buried insulator layer allows for the easier integration of an oxide spacer for selective epitaxial growth.

In order to further enhance the stress in the channel, a single or dual stressed liner can also be used in conjunction with semiconductor structure that includes the stress-inducing insulator of the present invention. Also, multilayered insulating films, e.g., oxide, nitride or combinations thereof, can be used in the present invention in forming the stress-inducing insulator.

DESCRIPTION OF THE INVENTION

The present invention, which provides a semiconductor structure that includes a stress-inducing insulator separating an upper semiconductor layer from a bottom semiconductor layer in at least one portion of a wafer, will now be described in greater detail. It is noted that the drawings that accompany the present application are provided for illustrative purposes and thus they are not drawn to scale.

As stated above and in broad terms, the present invention provides a semiconductor structure that comprises an upper semiconductor layer and a bottom semiconductor layer, wherein said upper semiconductor layer is separated from said bottom semiconductor layer in at least one region by a stress-inducing insulator, said stress-inducing insulator exerts a strain on the upper semiconductor layer. In accordance with the present invention, the stress-inducing insulator may have a preselected geometry which is determined by a first prepatterned semiconductor layer. This broad aspect of the present invention will be now discussed in greater detail by referring to FIGS. 1A-1D. Specifically, these drawings illustrate the basic processing steps that are used in the present invention to provide such a semiconductor structure.

Figure 1A:
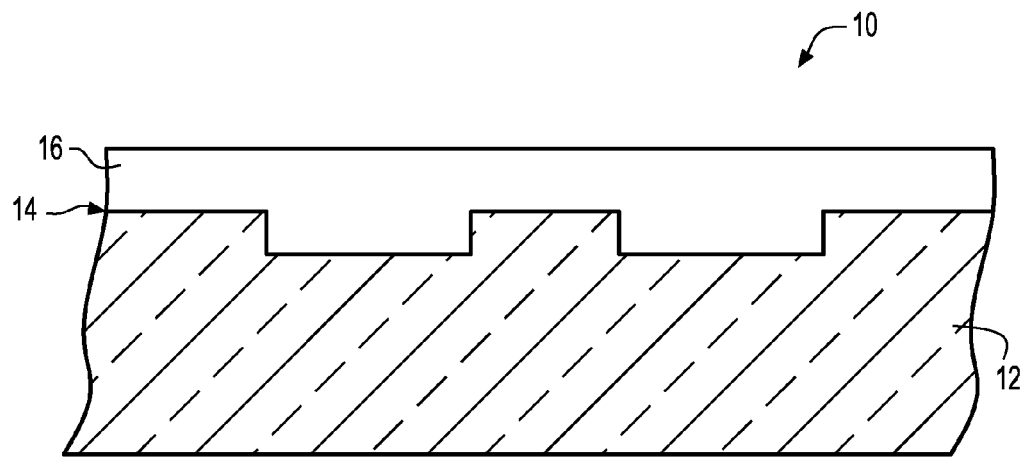
FIGS. 1A-1D are pictorial representations (through cross sectional views) illustrating the basic processing steps that are employed in the present invention for forming a semiconductor structure that includes a stress-inducing insulator separating an upper semiconductor layer from a bottom semiconductor layer.

Reference is first made to FIG. 1A which shows an initial structure 10 that is employed in the present invention in forming the inventive semiconductor structure. Specifically, the initial structure 10 shown in FIG. 1A comprises a first semiconductor layer 12 that includes a patterned surface 14 and a stress-inducing insulator 16 located on the patterned surface 14. It is emphasized that the first semiconductor layer 12 will subsequently be used as the upper semiconductor layer of the inventive semiconductor substrate. Moreover, it is further emphasized that the patterned surface 14 provides a preselected geometry to the stress-inducing insulator 16 which is essential for exerting a stress on the upper semiconductor layer of the final semiconductor structure of the present application.

The first semiconductor layer 12 employed in the present invention comprises any semiconductor material including, for example, Si, SiGe, SiC, SiGeC, Ge, GaAs, InAs, InP as well as other III/V or II/VI compound semiconductors. The first semiconductor layer 12 may also comprise a preformed semiconductor-on-insulator (e.g., Si-on-insulator or SiGe-on-insulator) wherein layer 12 represents the SOI layer of such materials. The first semiconductor layer 12 may also comprise a multilayered structure that includes a combination of said semiconductor materials, e.g., Si/SiGe. In a preferred embodiment of the present invention, the first semiconductor layer 12 is a Si-containing semiconductor material, with Si being most preferred.

The first semiconductor layer 12 may have any major or minor crystallographic orientation including, for example, (100), (111) or (110). The thickness of the first semiconductor layer 12 at this point of the inventive method may vary depending on the type of semiconductor material and the technique that was used to form the same.

The patterned surface 14 is formed into the first semiconductor layer 12 by lithography and etching. The lithographic step includes applying a photoresist to surface of the first semiconductor layer 12, exposing the photoresist to a desired pattern of radiation and developing the exposed photoresist utilizing a conventional resist developer. Etching of the first semiconductor layer 12 may be performed utilizing a dry etching process (such as reactive ion etching, ion beam etching, plasma etching or laser ablation) or a chemical wet etch process.

After forming the patterned surface 14 into the first semiconductor layer 12, the stress-inducing insulator 16 is formed utilizing a conventional deposition process such as, for example, chemical vapor deposition (CVD), plasma-enhanced chemical vapor deposition (PECVD), high-pressure CVD and other like techniques. The stress-inducing insulator 16 may comprise a nitride, an oxide or multilayers thereof. In one preferred embodiment of the present invention, the stress-inducing insulator 16 comprises a nitride or a nitride-containing multilayer.

The stress-inducing insulator 16 may be under compressive strain or under tensile strain. In the preferred embodiment in which the stress-inducing insulator 16 is a nitride, it is preferred that the nitride that is formed is under a tensile strain.

The thickness of the stress-inducing insulator 16 may vary depending upon the type of stressor material being deposited as well as the technique that was used in forming the same. Typically, the as deposited stress-inducing insulator 16 has a thickness from about 30 to about 200 nm, with a thickness from about 50 to about 100 nm being even more typical. If needed, the stress-inducing insulator 16 can be planarized after deposition utilizing a conventional planarization process such as, for example, chemical mechanical polishing and/or grinding.

Figure 1B:
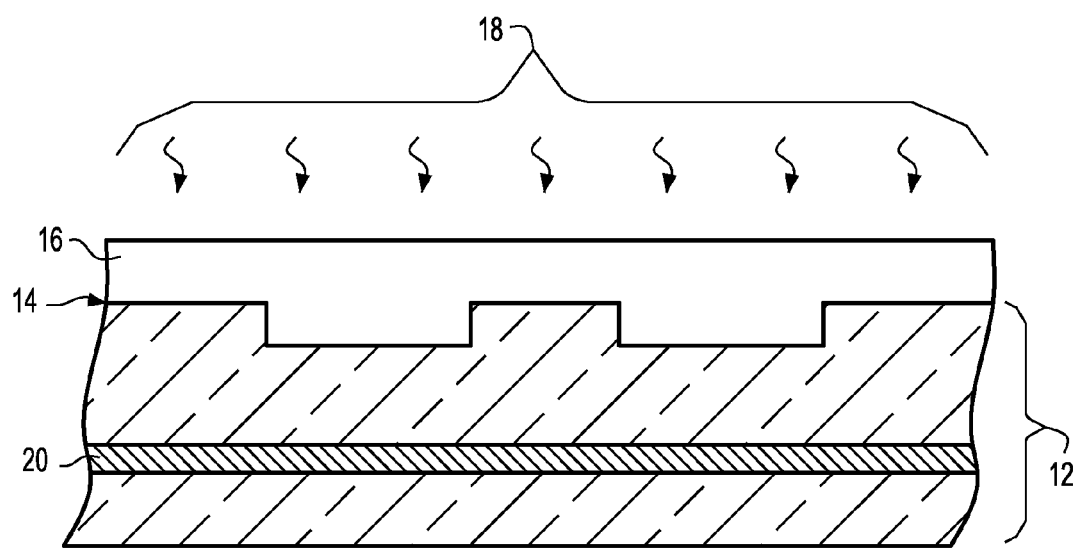

In some embodiments of the present invention, the initial structure 10 shown in FIG. 1A is subjected to an ion implantation process in which ions such as, for example hydrogen ions, are introduced into the first semiconductor layer 12. FIG. 1B illustrates the structure that is formed during this optional step of the present invention. In this drawing, reference numeral 18 denotes the ions being implanted into the initial structure 10, while reference numeral 20 denotes the ion implant region that is formed into the first semiconductor layer 12. It is noted that this embodiment of the present invention provides a means to thin the first semiconductor layer 12 to a desired thickness for use as an SOI device layer. Specifically, this optional step of the present invention implants through the stress-inducing insulator 16 into the underlying first semiconductor layer 12 such that a damaged region, i.e., implant region 20, is formed at the end of the ion's range. There is another possible embodiment where the optional implantation step occurs prior to the patterning and stressed insulator deposition. This may allow for a more uniform separation.

The structure shown in FIG. 1A, or optionally 1B, is then bonded to a second semiconductor layer 22 (or handle wafer), which will become the bottom semiconductor layer of the inventive semiconductor. The second semiconductor layer 22 employed in the present invention comprises a semiconductor material which may be composed of the same or different semiconductor as the first semiconductor layer 12. In one embodiment of the present invention, layers 12 and 22 are comprised of the same semiconductor material, with Si being most preferred. The second semiconductor layer 22 may have the same or different crystallographic orientation as the first semiconductor.

In embodiments in which a hybrid oriented (HOT) structure is to be formed, the second semiconductor layer 22 has a crystallographic orientation that is different than that of the first semiconductor layer. For example, when the first semiconductor layer 12 has a (100) crystal orientation, then the second semiconductor layer 22 may have a (110) or a (111) crystal orientation.

Furthermore, in some other embodiments of the present invention, it is highly preferred to have the notch on the semiconductor layers 12 and 22 rotated by 45° so that the channel is along the <100> direction. In this case, the nFET is expected to be sensitive to stress and the pFET is much less sensitive to stress compared to the <100> channel. Therefore, a highly tensile stressed insulator can be used for both nFETs and pFETs. nFET mobility is enhanced due to tensile in the upper semiconductor layer, and the pFET mobility is not affected.

Bonding is achieved by bringing the upper exposed surface of the stress-inducing layer 16 in contact with the second semiconductor layer 22, optionally applying an external force to the two semiconductor layers, and then heating the contacted structure at a temperature from about 200° to about 1050° C. for a time period from about 2 to about 20 hours. More typically, the bonding is performed at a temperature from about 200° to about 400° C. for a time period from about 2 to about 2 hours. The heating step is typically performed in the presence of an inert ambient such as, for example, in an atmosphere comprising at least one of He, Ar, $N_2$, Xe or Kr. A preferred inert ambient is $N_2$.

Figure 1C:
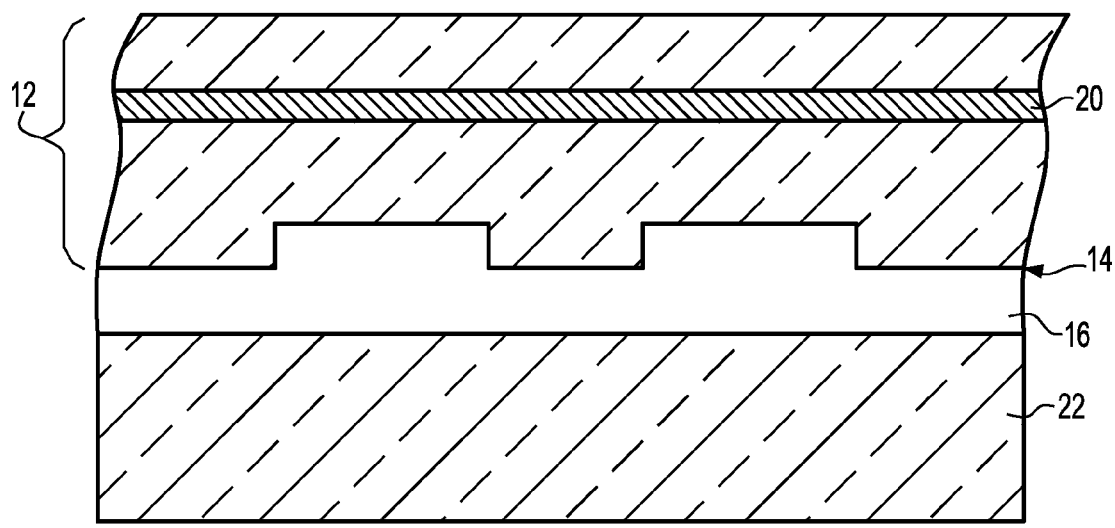

The bonded structure including the hydrogen implant region 20 is shown in FIG. 1C. Note that after bonding the structure is flipped such that the first semiconductor layer 12 becomes the upper semiconductor layer, while the second semiconductor layer 22 becomes the bottom semiconductor layer of an SOI structure.

Figure 1D:
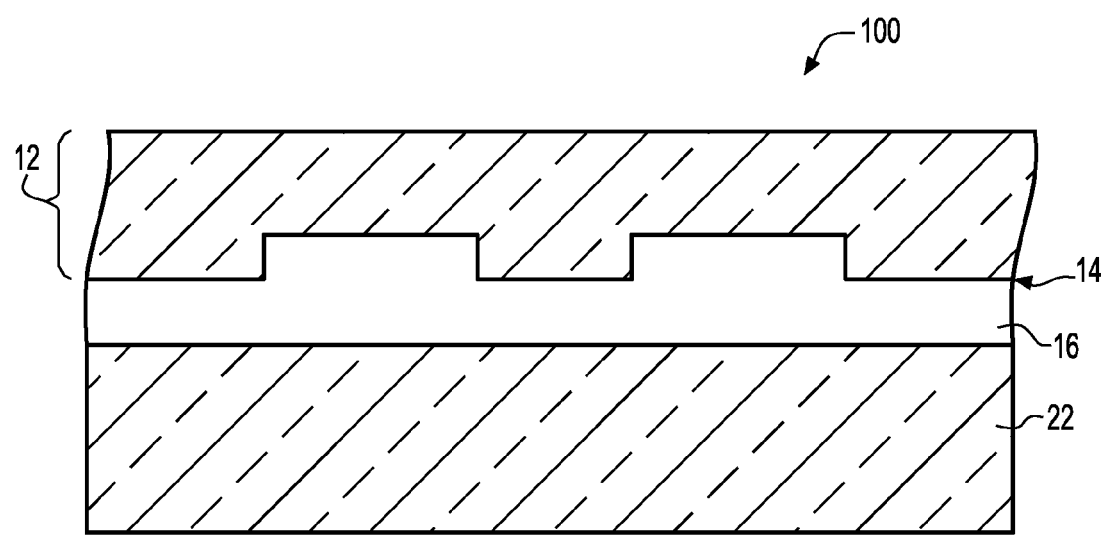

In the embodiment illustrated, the heating step causes the implant region 20 to become porous such that it can be removed from the bonded structure by subjecting the same to a splitting anneal that takes place after the bonding step. The splitting anneal is typically performed at a temperature from about 350° to 500° C. in an inert ambient. After the splitting anneal, the upper exposed surface of the first semiconductor layer 12 can be planarized utilizing a conventional planarization process, such as, chemical mechanical polishing and/or grinding. The resultant structure 100 is shown in FIG. 1D. Note that the structure shown in FIG. 1D is also the structure that can be obtained after bonding, if no implant region, was formed into the first semiconductor layer 12.

In some embodiments, the first semiconductor layer 12, i.e., the upper SOI layer of the inventive structure, can be thinned at this point of the present invention. This optional thinning step can thin the first semiconductor layer 12 down into the ultra-thin SOI regime. Thinning can be achieved by planarization or etching or thermal oxidation followed by removal of oxide. Multiple times of oxidation and oxide etching can be used if needed. In some embodiments, thinning into the ultra thin regime can be achieved by the ion implant step and the splitting anneal mentioned above (known as "smart cut" technique).

The semiconductor structure shown in FIG. 1D, which is designated by reference numeral 100, denotes the inventive semiconductor structure. As shown, this structure includes an upper semiconductor layer 12, a stress-inducing layer 16 having a preselected geometry and a bottom semiconductor layer 22. The structure 100 shown in FIG. 1D can be used as is, as an SOI structure, or alternatively, the structure 100 can be further processed into a hybrid oriented (HOT) structure.

The later case will now be described in greater detail by referring to FIGS. 2A-2D. When the semiconductor structure 100 is to be used in forming a HOT structure, the upper semiconductor layer 12 must have a different crystallographic orientation than that of the bottom semiconductor layer 22. After forming the structure shown in FIG. 1D wherein the upper semiconductor layer 12 has a different crystallographic orientation than the bottom semiconductor layer 22, a dielectric layer 28 is formed on an exposed surface of the upper semiconductor layer 12. The structure including the dielectric layer 28 located on a surface of the upper semiconductor layer 12 is shown, for example, in FIG. 2A.

The dielectric layer 28 can be formed atop the upper semiconductor layer 12 by a thermal process, such as oxidation or nitridation, or by a conventional deposition process, such as chemical vapor deposition (CVD), plasma-enhanced CVD, atomic layer deposition, chemical solution deposition as well as other like deposition processes.

The dielectric layer 28 comprises an insulating material including, for example, an oxide, a nitride, an oxynitride or multilayers thereof. In one highly preferred embodiment of the present invention, the dielectric layer 28 that is formed atop the exposed surface of the upper semiconductor layer 12 comprises an oxide.

The thickness of the dielectric layer 28 formed at this point of the present application may varying depending on the type of insulating material employed as well as the technique that was employed in forming the same. Typically, the dielectric layer 28 has a thickness from about 5 to about 100 nm, with a thickness from about 50 to about 100 nm being even more typical.

After forming the dielectric layer 28 onto an expose surface of the upper semiconductor layer 12 of the semiconductor structure 100, a mask 30 is then formed on a predetermined portion of the dielectric layer 28 so as to protect at least one portion of the semiconductor structure 100, while leaving at least one other portion of the semiconductor structure 100 unprotected. The at least one protected portion of the structure 100 defines a SOI region 32 in which the stress-inducing insulator will remain between the upper semiconductor layer 12 and the bottom semiconductor layer 22, whereas the unprotected portion of the semiconductor structure 100 defines a bulk-semiconductor region 34 in which the stress-inducing insulator 16 will be subsequently removed from the structure.

In one embodiment, the mask 30 is formed on a predetermined portion of the dielectric layer 28 by applying a photoresist mask to the entire surface of the semiconductor structure 100. After application of the photoresist mask, the mask is patterned by lithography, which includes the steps of exposing the photoresist to a pattern of radiation and developing the pattern utilizing a resist developer. In another embodiment, the mask 30 is a nitride or oxynitride layer that is formed and patterned utilizing lithography and etching. The nitride or oxynitride mask 30 may be removed after defining the bulk-semiconductor region 34.

After forming the mask 30 atop the semiconductor structure 100 including the dielectric layer 28, the structure is subjected to one or more etching steps so as to expose a surface of the bottom semiconductor layer 22 in the bulk-semiconductor region 34. Specifically, the one or more etching steps used at this point of the present invention removes the unprotected portions of the dielectric layer 28, as well as underlying portion of the upper semiconductor layer 12, and a portion of the stress-inducing insulator 16, which separates the upper semiconductor layer 12 from the bottom semiconductor layer 22, stopping on the underlying bottom semiconductor layer 22. The etching may be performed utilizing a single etching process or multiple etching steps may be employed. The etching used at this point of the present invention may include a dry etching process such as reactive-ion etching, ion beam etching, plasma etching or laser etching, a wet etching process wherein a chemical etchant is employed or any combination thereof. In a preferred embodiment of the present invention, reactive-ion etching (RIE) is used in selectively removing the unprotected portions of the dielectric layer 28, the upper semiconductor layer 12 and the stress-inducing insulator 16 in the bulk-semiconductor region 34.

Figure 2A:
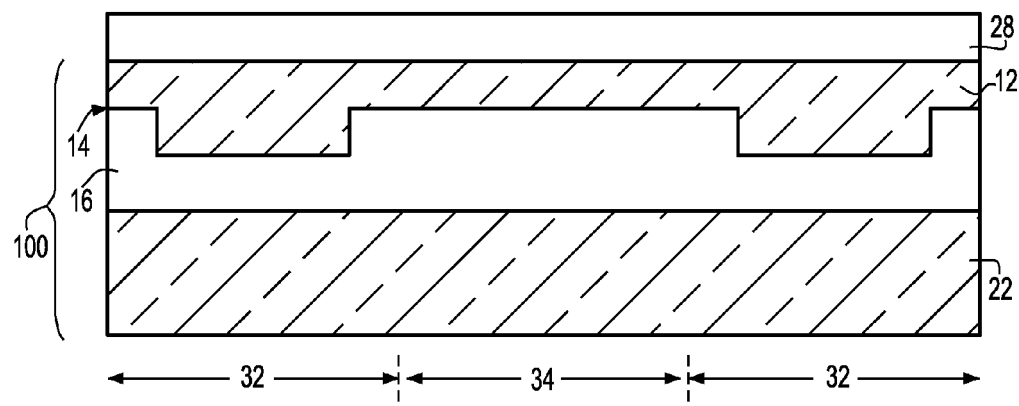
FIGS. 2A-2D are pictorial representations (through cross sectional views) illustrating the basic processing steps of an embodiment of the present invention in which a semiconductor structure, as formed in FIGS. 1A-1D, is used in forming a hybrid oriented semiconductor structure.
Figure 2B:
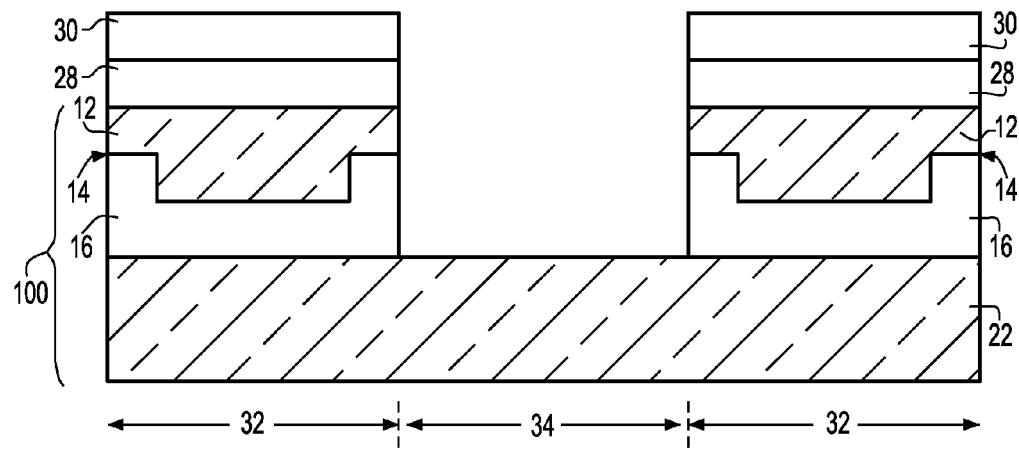
Figure 2C:
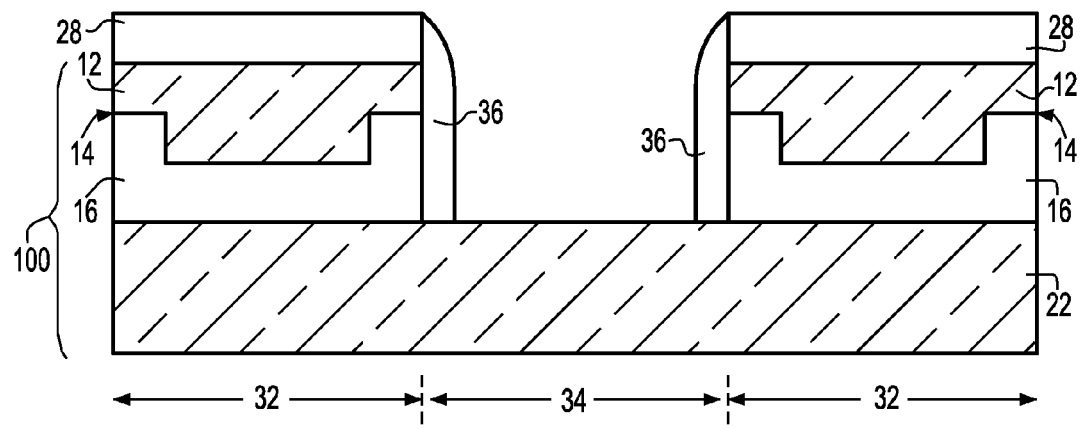

The resultant structure after the etching process has been performed is shown, for example, in FIG. 2B. Note that the sidewalls of the protected SOI region 32, i.e., the dielectric layer 28, the upper semiconductor layer 12 and the stress-inducing insulator 16, are exposed after this etching step. As shown, the exposed sidewalls of layers 28, 12 and 16 are aligned with an outer most edge of mask 30. In this drawing, two SOI regions 32 and one bulk-semiconductor region 34 are shown for illustrative purposes only and that the present invention contemplates forming any number of such regions in the structure 100.

After exposing a portion of the bottom semiconductor layer 22 in the bulk-semiconductor region 34, the mask 30 is removed from the structure shown in FIG. 2B utilizing a conventional resist stripping process and then a liner or spacer 36 is typically, but not always, formed on the exposed sidewalls of layers 28, 12 and 16. The liner or spacer 36, which is optional, is formed by deposition and etching. The liner or spacer 36 is comprised of an insulating material such as, for example, an oxide. The structure including the optional liner or spacer 36 is shown, for example in FIG. 2C.

After forming the optional liner or spacer 36, a semiconductor material 38 is formed on the exposed bottom semiconductor layer 22 in the bulk-semiconductor region 34. In accordance with the present invention, semiconductor material 38 has a crystallographic orientation that is the same as the crystallographic orientation of the bottom semiconductor layer 22. Note that maintaining selectivity to oxide is easier than nitride, so an oxide spacer 36 will allow epitaxial growth conditions with higher growth rate and fewer defects. The resultant structure is shown, for example in FIG. 2D. Note that a dotted line is present between the bottom semiconductor layer 22 and the regrown semiconductor material 38 for illustrative purposes only.

The semiconductor material 38 may comprise any Si-containing semiconductor, such as Si, strained Si, SiGe, SiC, SiGeC or combinations thereof, which is capable of being formed utilizing a selective epitaxial growth method. In some preferred embodiments, semiconductor material 38 is comprised of Si. In the present invention, semiconductor material 38 may be referred to as a regrown semiconductor material 38.

Next, the structure (see, FIG. 2D as well) is subjected to a planarization process such as chemical mechanical polishing (CMP) or grinding such that the upper surface of the semiconductor material 38 in the bulk-semiconductor region 34 is substantially planar with the upper surface of the upper semiconductor layer 12 in the SOI region 32. Note that previously protected portion of the dielectric layer 28 is removed during this planarization process.

After providing the substantially planar surfaces, standard CMOS processes including, for example, device isolation formation and gate formation can be employed. Specifically, after providing the structure shown in FIG. 1D or 2D, an isolation region 40, such as a shallow trench isolation region, is typically formed so as to isolate either different types of devices from each other or different regions such as, for example, the SOI region 32 from the bulk-semiconductor region 34. The isolation region 40 is formed utilizing processing steps that are well known to those skilled in the art including, for example, trench definition and etching, optionally lining the trench with a diffusion barrier, and filling the trench with a trench dielectric such as an oxide. After the trench fill, the structure may be planarized and an optional densification processing step may be performed to densify the trench dielectric.

Figure 2D:
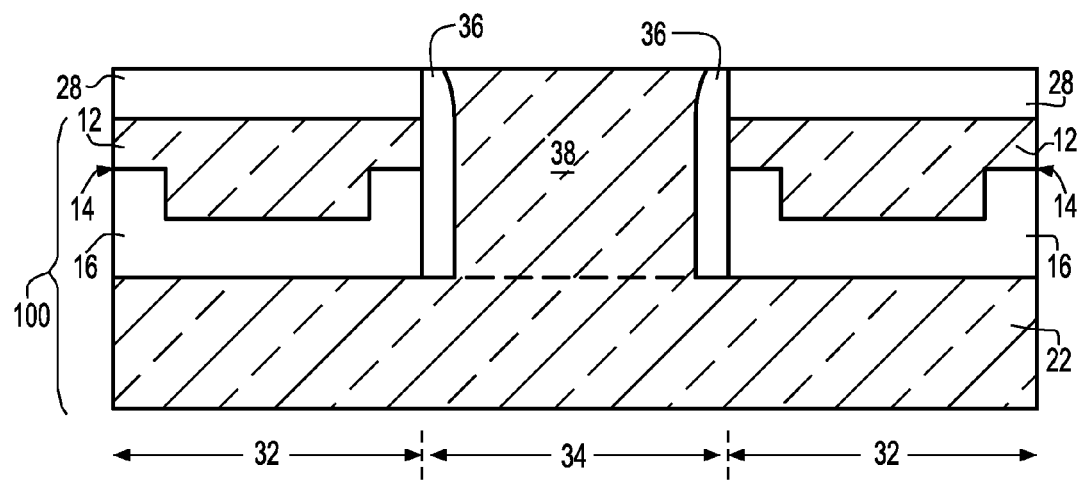

Semiconductor devices, i.e., pFETs and nFETs, are now formed on the exposed semiconductor layers, i.e., the upper semiconductor layer 12 and, if present, the regrown semiconductor 38. Specifically, a first semiconductor device 42 is formed on the upper semiconductor layer 12 and a second semiconductor device 44 can be formed on a different region of the upper semiconductor layer (for the embodiments in which FIG. ID is employed) or the regrown semiconductor 38 (for the embodiments in which FIG. 2D is employed). Despite showing the presence of a single semiconductor device in each device region, the present invention contemplates forming a plurality of semiconductor device in each region as appropriate. In accordance with the present invention, the first semiconductor device 42 may be a pFET or nFET, whereas the second semiconductor device 44 is an nFET or pFET, with the proviso that the first semiconductor devices are different from second semiconductor devices and optionally that each specific devices is located on a crystal orientation that provides that device with high performance.

Figure 3A:
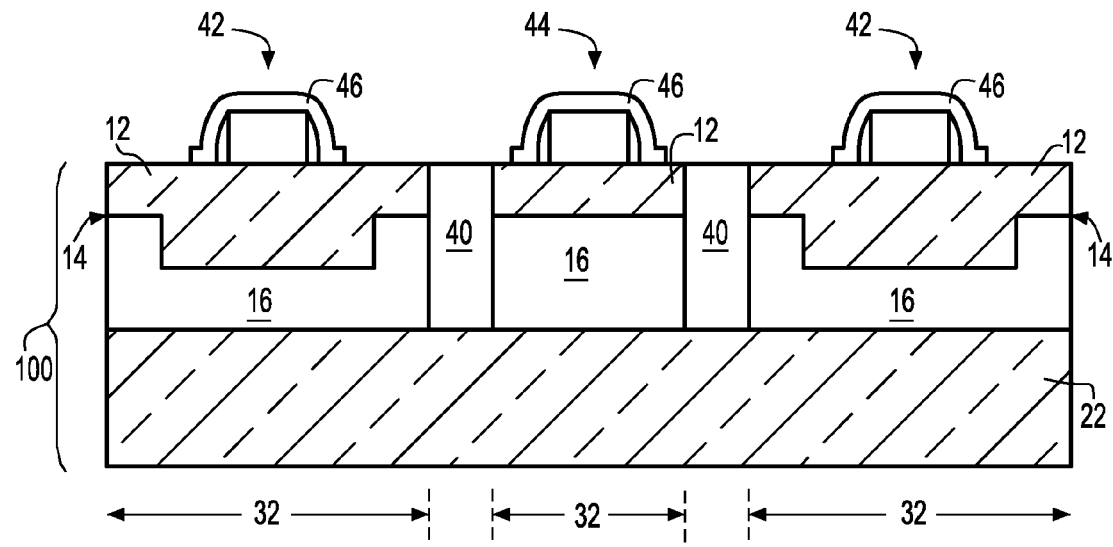
FIGS. 3A and 3B are pictorial representations (through cross sectional views) illustrated FETs formed on the semiconductor structures shown in FIGS. 1D and 2D, respectively.
Figure 3B:
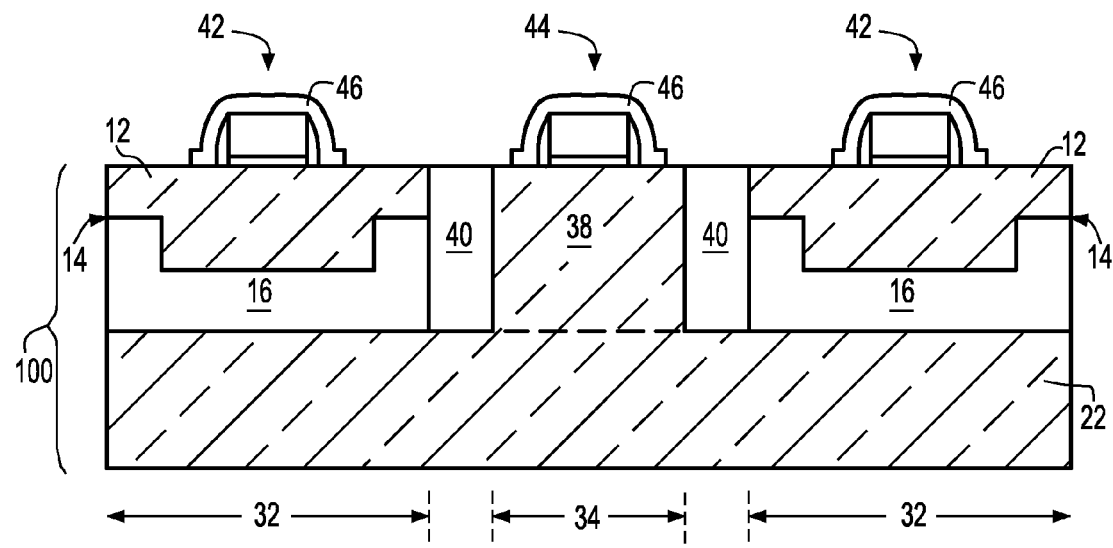

The pFETs and nFETs are formed utilizing standard CMOS processing steps that are well known to those skilled in the art. Each FET includes a gate dielectric, a gate conductor, an optional hardmask located atop the gate conductor, a spacer located on sidewalls of at least the gate conductor and source/drain diffusion regions. FIGS. 3A and 3B are pictorial representations of such semiconductor devices located on the structure shown in FIG. ID and FIG. 2D.

To further enhance the stress in the structures shown in FIGS. 3A and 3B, a stress liner (single or dual), such as a SiN liner, 46 can be formed utilizing conventional techniques, including, for example, deposition and etching, that are well known in the art. As known to those skilled in the art, a tensile strained stress liner 46 is formed in the device region that will include the nFET devices, while a compressively strained stress liner 46 will be formed in the device region including the pFET devices.

It is noted that in FIG. 3A all the semiconductor devices are SOI like devices and each device is located on an upper semiconductor layer 12 having a specific crystal orientation. In FIG. 3B, some of the semiconductor devices are SOI like devices, while others are bulk-like devices. In that drawing, performance enhancement can be achieved when nFETs are SOI devices, and pFETs are bulk-like devices.

In some embodiments in which the structure shown in FIG. 2D is formed, the upper semiconductor layer 12 is a Si-containing material that has a (100) crystal orientation, while the regrown semiconductor material 38 has a (110) crystal orientation. In yet other embodiments, the upper semiconductor layer 12 is a Si-containing material having a (110) crystal orientation and the regrown semiconductor 38 has a (100) crystal orientation. In the latter embodiment, the stress-inducing insulator 16 has a compressive stress associated herewith.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:

forming a stress-inducing insulator on a prepatterned surface of a first semiconductor layer;

bonding an exposed surface of said stress-inducing insulator to a second semiconductor layer to form a structure including said stress-inducing insulator located between said first semiconductor and said second semiconductor layers; and flipping said structure such that said first semiconductor layer defines an upper semiconductor layer and said second semiconductor layer defines a bottom semiconductor layer in which said stress-inducing insulator exerts a strain on the upper semiconductor layer.

2. The method of claim 1 further comprising forming a mask onto said upper semiconductor layer, said mask protects a portion of the structure defining a SOI region, while leaving another portion unprotected defining a bulk-semiconductor region; etching said unprotected portion stopping atop a surface of said bottom semiconductor layer; epitaxial growing a semiconductor layer of a same crystal orientation as that of the bottom semiconductor layer from said exposed surface; and planarizing to provide a hybrid structure in which an upper surface of said semiconductor layer of the same crystal orientation as that of the bottom semiconductor layer is substantially coplanar to an upper surface of said first semiconductor layer.

3. The method of claim 2 further comprising forming at least a first semiconductor device on said upper semiconductor layer and a second semiconductor device on said epitaxial semiconductor layer.

4. The method of claim 3 further comprising forming a device isolation region separating said first semiconductor device from said second semiconductor device.

5. The method of claim 2 further comprising implanting through said stress-inducing layer into said first semiconductor layer, said implanting occurs prior to or after said step of forming said stress-inducing insulator.

6. The method of claim 1 further comprising forming at least a first semiconductor device and a second semiconductor device on said upper semiconductor layer.

7. The method of claim 6 further comprising forming a device isolation region separating said first semiconductor device from said second semiconductor device.

* * * * *